(12) United States Patent
Hopper et al.

(10) Patent No.: US 6,740,956 B1
(45) Date of Patent: May 25, 2004

(54) METAL TRACE WITH REDUCED RF IMPEDANCE RESULTING FROM THE SKIN EFFECT

(75) Inventors: Peter J. Hopper, San Jose, CA (US); Peter Johnson, Sunnyvale, CA (US); Kyuwoon Hwang, Palo Alto, CA (US); Michael Mian, Livermore, CA (US); Robert Drury, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/219,896

(22) Filed: Aug. 15, 2002

(51) Int. Cl.[7] ............................................... H01L 29/00
(52) U.S. Cl. ....................................... 257/528; 257/531
(58) Field of Search ................................ 257/531, 499, 257/528, 529, 532, 774; 438/637; 336/200

(56) References Cited

U.S. PATENT DOCUMENTS

| | | | |
|---|---|---|---|
| 3,573,540 A | 4/1971 | Osepchuk | 315/3.5 |
| 4,165,558 A | 8/1979 | Armitage, Jr. et al. | 29/572 |
| 5,434,094 A | 7/1995 | Kobiki et al. | 437/40 |
| 5,952,704 A | 9/1999 | Yu et al. | 257/531 |
| 5,998,299 A | 12/1999 | Krishnan | 438/694 |
| 6,191,023 B1 * | 2/2001 | Chen | 438/612 |
| 6,326,673 B1 * | 12/2001 | Liou | 257/531 |
| 6,444,517 B1 * | 9/2002 | Hsu et al. | 438/238 |

* cited by examiner

*Primary Examiner*—Tuan H. Nguyen
(74) *Attorney, Agent, or Firm*—Mark C. Pickering (57) ABSTRACT

The RF impedance of a metal trace at gigahertz frequencies is reduced by forming the metal trace to have a base region and a number of fingers that extend away from the base region. When formed to have a number of loops, the metal trace forms an inductor with an increased Q.

17 Claims, 6 Drawing Sheets

METAL TRACE WITH REDUCED RF IMPEDANCE RESULTING FROM THE SKIN EFFECT

RELATED APPLICATION

The present invention is related to application Ser. No. 10/219,791 for "Dual Damascene Metal Trace with Reduced RF Impedance Resulting from the Skin Effect" by Peter J. Hopper et al., application Ser. No. 10/219,235 for "Conductive Trace with Reduced RF Impedance Resulting from the Skin Effect" by Peter J. Hopper et al., and application Ser. No. 10/219,212 for "Etched Metal Trace with Reduced RF Impedance Resulting from the Skin Effect" by Peter J. Hopper et al., all filed on an even date herewith.

BACKGROUND OF THE INVENTION

1. Field of the Invention

The present invention relates to metal traces and, more particularly, to a metal trace with reduced RF impedance resulting from the skin effect.

2. Description of the Related Art

Metal traces are common integrated circuit elements that are used in a multi-level interconnect structure to connect together various elements of a circuit. In addition, a metal trace can be used to form an integrated circuit inductor by forming the trace to have a number of coils or loops. Inductors are common circuit elements in radio frequency (RF) applications, such as digital cellular telephones.

Figure 1A:
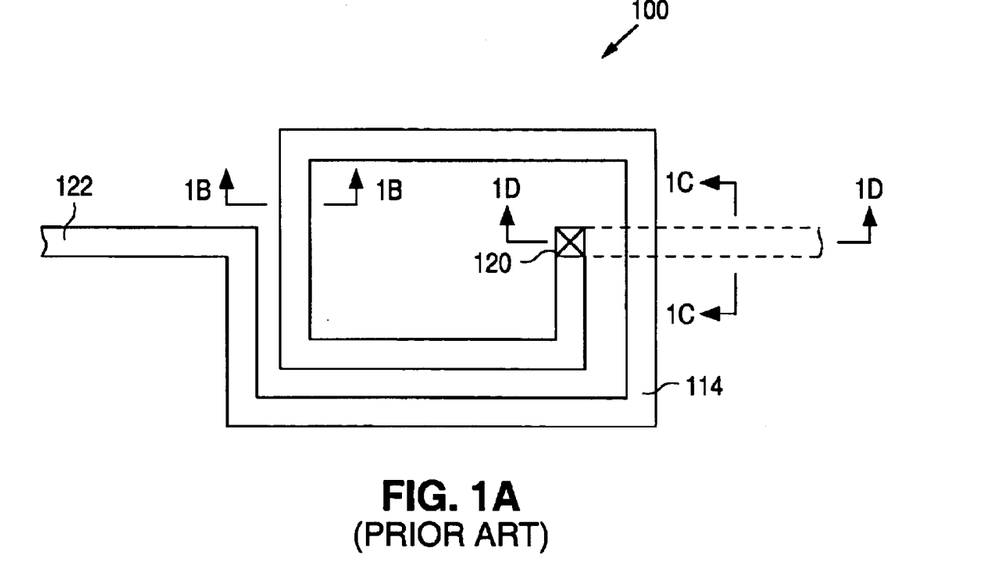
FIG. 1A is a plan view illustrating a prior art integrated circuit inductor 100.
Figure 1B:
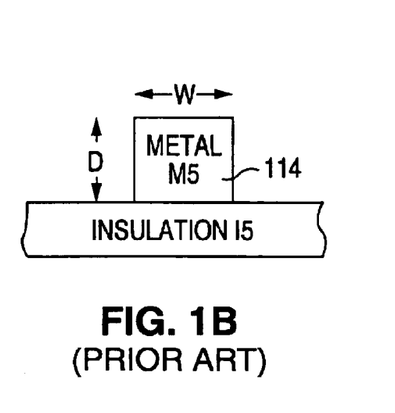
FIG. 1B is a cross-sectional view taken along lines 1B—1B of FIG. 1A.
Figure 1C:
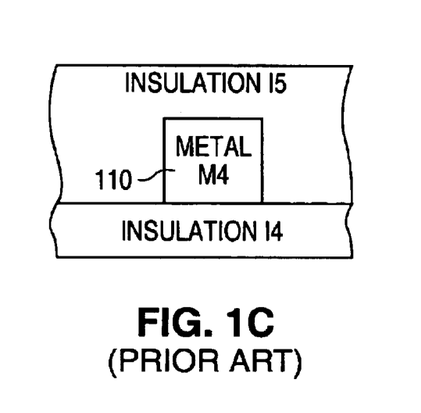
FIG. 1C is a cross-sectional view taken along lines 1C—1C of FIG. 1A.
Figure 1D:
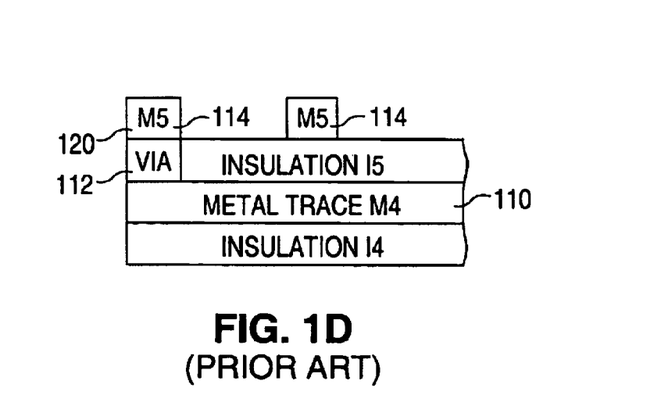
FIG. 1D is a cross-sectional view taken along lines 1D—1D of FIG. 1A.

FIG. 1A shows a plan view that illustrates a prior art integrated circuit inductor 100. FIG. 1B shows a cross-sectional view taken along lines 1B—1B of FIG. 1A. FIG. 1C shows a cross-sectional view taken along lines 1C—1C of FIG. 1A. FIG. 1D shows a cross-sectional view taken along lines 1D—1D of FIG. 1A.

As shown in FIGS. 1A–1D, inductor 100 is formed on top of a four-metal layer interconnect structure that includes a fourth layer of insulation material I4, and a metal trace 110 that is formed on insulation layer I4 from a fourth metal layer M4. In addition, the metal interconnect structure includes a fifth layer of insulation material I5 that is formed on metal trace 110, and a via 112 that is formed through insulation layer I5 to make an electrical connection with metal trace 110.

As further shown in FIGS. 1A–1D, inductor 100 includes a metal trace 114 that is formed on top of the fifth layer of insulation material I5 from a fifth metal layer M5. Metal trace 114, which has a width W and a depth D, has a first end 120 that is formed over via 112 to make an electrical connection with via 112, and a second end 122. Metal trace 114, which makes one and a half loops in the same plane, is typically formed on top of the metal interconnect structure to avoid inducing currents in the substrate.

One important measure of a metal trace is the RF impedance of the trace, which affects the quality factor or Q of an inductor formed from the metal trace. High Q inductors are desirable in a number of RF circuits, such as resonant circuits. The Q of an inductor is a measure of the ratio of magnetic energy stored in the inductor versus the total energy fed into the inductor, and is given by equation (EQ.) 1 as:

$$Q = \omega L / Z, \quad \text{EQ. 1}$$

where $\omega$ is related to the frequency f of the signal applied to the inductor ($\omega = 2(\text{pi})(f)$), L represents the inductance of the inductor, and Z represents the RF impedance of the inductor. (Impedance is the vector sum of resistance and reactance, and introduces a phase shift.) Thus, as indicated by EQ. 1, the smaller the impedance, the higher the Q of the inductor.

One problem with metal traces is that when gigahertz-frequency signals are placed on the trace, the skin effect causes current to flow primarily at the surface. This effectively increases the RF impedance of the trace which, in turn, lowers the Q of an inductor formed from the trace.

One common approach to reducing the impedance of an integrated circuit inductor is to increase the size of the metal trace. However, in integrated circuit applications, there are practical limitations to the size of the metal trace. As a result, there is a need for a metal trace with reduced RF impedance which, in turn, allows a high Q integrated circuit inductor to be realized from the trace.

SUMMARY OF THE INVENTION

The present invention provides a metal trace that has reduced RF impedance at gigahertz frequencies. When the metal trace is formed to have a number of loops, the looping metal trace forms an integrated circuit inductor, while the reduced RF impedance increases the Q of the inductor.

A semiconductor structure in accordance with the present invention includes a layer of insulation material that is formed over a semiconductor substrate. In addition, the semiconductor structure includes a metal trace that is formed in the layer of insulation material. The metal trace has a base region and a plurality of spaced-apart fingers that extend away from the base region. The metal trace can be formed to have a number of loops, and the loops can be formed to lie substantially in the same plane.

The present invention also includes a method of forming a semiconductor structure that includes the steps of forming a layer of insulation material over a semiconductor substrate. The layer of insulation material has a first opening that defines a first side wall and an opposing second side wall.

The method also includes the steps of forming a first layer of conductive material on the layer of insulation material to fill up the first opening, and anisotropically etching the first layer of conductive material to form a first conductive spacer that adjoins the first side wall and the second side wall, and a second opening.

The method further includes the step of forming a first layer of isolation material on the layer of insulation material and the first conductive spacer to fill up the second opening. In addition, the method includes the step of forming a conductive region on the first conductive spacer and the first layer of isolation material. The conductive region makes an electrical connection with the first conductive spacer.

The method can also include the step of anisotropically etching the first layer of isolation material to form a first isolation spacer that adjoins the first conductive spacer, and a third opening. Further, the method can include the steps of forming a second layer of conductive material on the layer of insulation material to fill up the third opening, and anisotropically etching the second layer of conductive material to form a second conductive spacer that adjoins the first isolation spacer, and a fourth opening.

In addition, the method can include the step of forming a second layer of isolation material on the layer of insulation material and the first conductive spacer to fill up the fourth opening. The conductive region makes an electrical connection with the first and second conductive spacers.

A better understanding of the features and advantages of the present invention will be obtained by reference to the following detailed description and accompanying drawings that set forth an illustrative embodiment in which the principles of the invention are utilized.

BRIEF DESCRIPTION OF THE DRAWINGS

FIGS. 3A–3D are views illustrating an example of an integrated circuit inductor 300 in accordance with the present invention.

DETAILED DESCRIPTION OF THE INVENTION

Figure 2A:
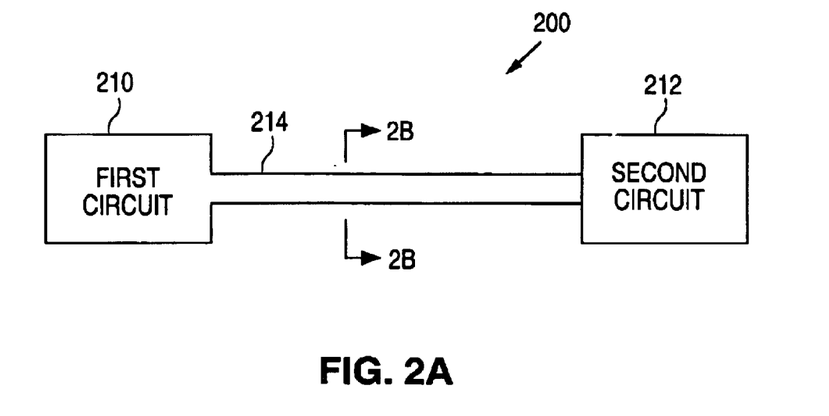
FIGS. 2A–2B are views illustrating an integrated circuit structure 200 in accordance with the present invention.
Figure 2B:
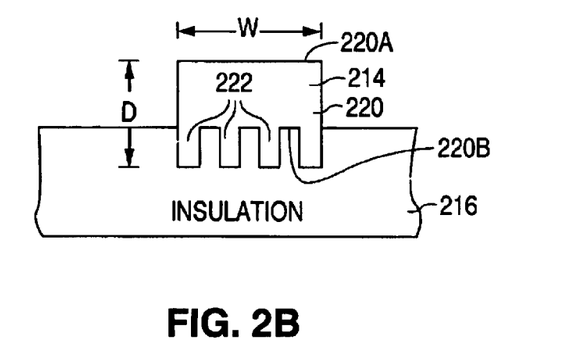

FIGS. 2A–2B show views that illustrate an integrated circuit structure 200 in accordance with the present invention. FIG. 2A shows a plan view, while FIG. 2B shows a cross-sectional view taken along line 2B—2B of FIG. 2A. As described in greater detail below, structure 200 utilizes a metal line that has been formed to have an increased surface area. The increased surface area, in turn, reduces the impedance of the line at gigahertz frequency levels.

As shown in FIGS. 2A–2B, structure 200 includes a first circuit 210 that operates on a gigahertz frequency signal, and a second circuit 212 that operates on a gigahertz frequency signal. In addition, structure 200 includes a metal trace 214 that is electrically connected to circuits 210 and 212. Metal trace 214, which is formed on a layer of insulation material 216, passes gigahertz frequency signals between circuits 210 and 212.

As further shown in FIG. 2B, metal trace 214 has a width W (of approximately four microns) and a depth D (of approximately four microns). Metal trace 214 also has a base region 220 with a top side 220A and a bottom side 220B, and a number of spaced-apart fingers 222 that extend away from bottom side 220B. Fingers 222, in turn, substantially increase the surface area of metal trace 214 when compared to a conventional metal trace that has the same width W and depth D, such as metal trace 114.

In operation, when a signal in the gigahertz frequency range is placed on metal trace 214 by circuit 210 or circuit 212, current flows primarily at the surface of metal trace 214 due to the skin effect. Thus, in accordance with the present invention, since current flows primarily at the surface and fingers 222 substantially increase the surface area of metal trace 214, fingers 222 allow more current to flow. As a result, fingers 222 effectively reduce the RF impedance of metal trace 214.

Thus, the present invention reduces the RF impedance of a metal trace that interconnects two gigahertz frequency devices. (The metal trace connecting together two gigahertz frequency devices can be formed from any one of the layers of metal used to form the metal interconnect structure, such as the first layer of metal, or a combination of metal layers and vias.)

Figure 3A:
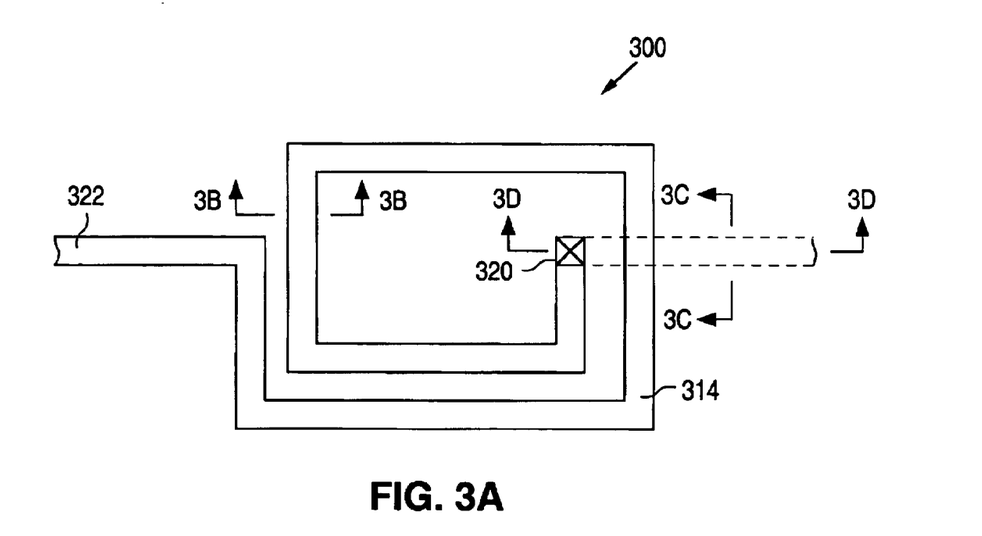
FIG. 3A is a plan view.
Figure 3B:
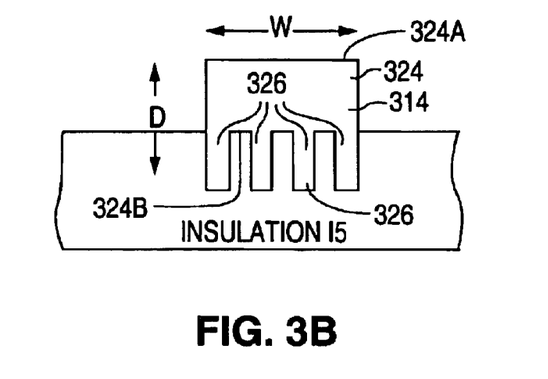
FIG. 3B is a cross-sectional view taken along lines 3B—3B of FIG. 3A.
Figure 3C:
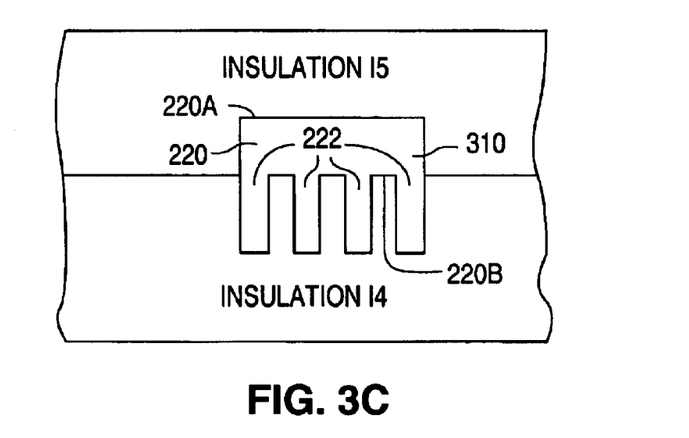
FIG. 3C is a cross-sectional view taken along lines 3C—3C of FIG. 3A.
Figure 3D:
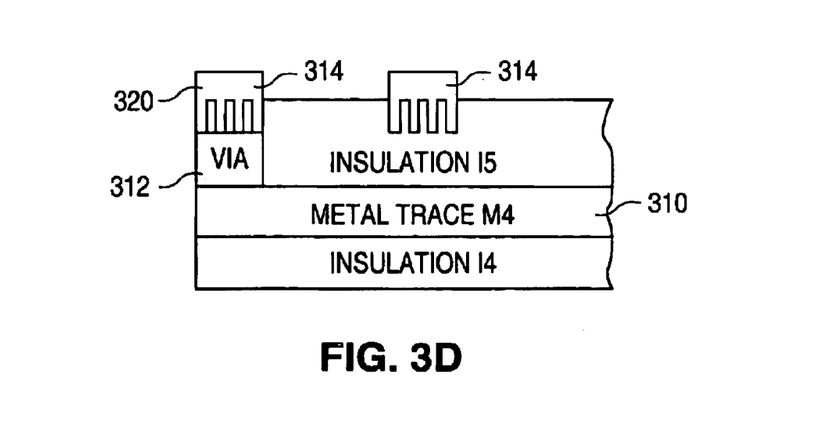
FIG. 3D is a cross-sectional view taken along lines 3D—3D of FIG. 3A.

FIGS. 3A–3D show views that illustrates an example of an integrated circuit inductor 300 in accordance with the present invention. FIG. 3A shows a plan view. FIG. 3B shows a cross-sectional view taken along lines 3B—3B of FIG. 3A. FIG. 3C shows a cross-sectional view taken along lines 3C—3C of FIG. 3A. FIG. 3D shows a cross-sectional view taken along lines 3D—3D of FIG. 3A.

As described in greater detail below, inductor 300 is formed from a metal trace that has been formed to have an increased surface area. The increased surface area, in turn, reduces the RF impedance of the metal trace when gigahertz-frequency signals are placed on the trace. As a result, the metal trace of the present invention can be used to form integrated circuit inductors with an increased Q.

In the example shown in FIGS. 3A–3D, like inductor 100, inductor 300 is formed on top of a four metal layer interconnect structure. The interconnect structure includes a fourth layer of insulation material I4, and a metal trace 310 that is formed on insulation layer I4 from a fourth metal layer M4. In addition, the metal interconnect structure includes a fifth layer of insulation material I5 that is formed on metal trace 310, and a via 312 that is formed through insulation layer I5 to make an electrical connection with metal trace 310.

As further shown in FIGS. 3A–3D, inductor 300 includes a metal trace 314 that is formed on top of the fifth layer of insulation material I5 from a fifth metal layer M5. (Metal trace 314 can be formed from any metal layer, including the first metal layer. The fifth metal layer of the present example is but one possibility. By forming inductor 300 on top of a metal interconnect structure, however, induced substrate currents are minimized).

In addition, metal trace 314 has a first end 320 that is formed over via 312 to make an electrical connection with via 312, and a second end 322. (In this example, second end 322 can be connected to a via connected to a metal-4 trace, or a via connected to a pad or another overlying metal trace.)

Metal trace 314 also has a width W (of approximately four microns) and a depth D (of approximately four microns). Further, metal trace 314 makes one and a half loops in the same plane. (Trace 314 is not limited to one and a half loops, but can be formed with a different number of loops.)

As further shown in FIG. 3B, metal trace 314 has a base region 324 with a top side 324A and a bottom side 324B, and a number of spaced-apart fingers 326 that extend away from bottom side 324B. Fingers 326, in turn, substantially increase the surface area of metal trace 314 when compared to a conventional metal trace that has the same width W and depth D, such as metal trace 114.

In operation, when a signal in the gigahertz frequency range is input to inductor 300, current flows primarily at the surface of metal trace 314 due to the skin effect. Thus, in accordance with the present invention, since current flows primarily at the surface and fingers 326 substantially increase the surface area of metal trace 314, fingers 326 allow more current to flow. As a result, fingers 326 effectively reduce the RF impedance of metal trace 314, thereby increasing the Q of inductor 300.

As a result, fingers 326 effectively reduce the RF impedance of metal trace 314, thereby increasing the Q of inductor 300. In addition, as illustrated by FIG. 3C, metal trace 310 can be formed as metal trace 214, thereby providing a low RF impedance pathway from inductor 300 (a first gigahertz frequency device) to another gigahertz frequency device.

As a result, the present invention also reduces the RF impedance of a metal trace that interconnects two gigahertz frequency devices. (The metal trace connecting together two gigahertz frequency devices can be formed from one layer of metal, such as a first layer of metal, or a combination of metal layers and vias.)

Figure 4A:
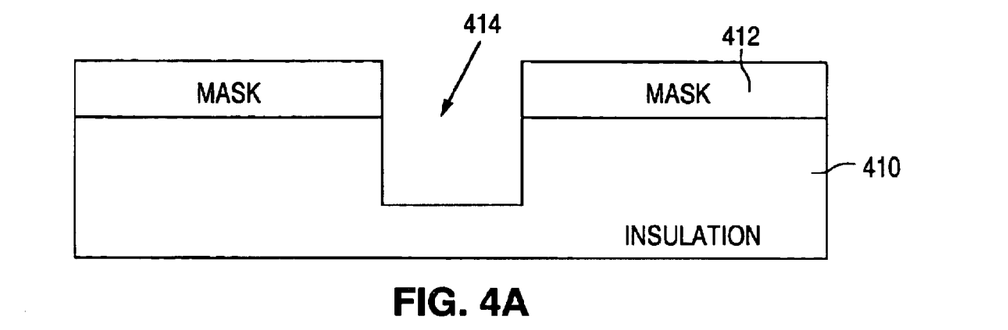
FIGS. 4A–4I are cross-sectional drawings illustrating an example of a method of forming inductor 300 in accordance with the present invention.

FIGS. 4A–4I show cross-sectional drawings that illustrate an example of a method of forming a metal trace in accordance with the present invention. As shown in FIG. 4A, the method utilizes a layer of insulation material 410 that has been formed over a semiconductor integrated circuit device, and a number of vias (or contacts) that have been formed through insulation layer 410.

For example, insulation layer 410 can be formed on the top layer of metal that is used to form the metal interconnect structure of the semiconductor device. Thus, with a semiconductor integrated circuit that utilizes a five layer metal process, insulation layer 410 can be formed over the metal-4 layer. Alternately, insulation layer 410 can be formed on a semiconductor substrate or any other layer of metal.

As further shown in FIG. 4A, the method of the present invention begins by forming a layer of masking material 412 on insulation layer 410. Masking material 412 is then patterned. Following this, the exposed regions of insulation layer 410 are etched to form a first trace opening 414 in insulation layer 410.

First trace opening 414 can be formed to have a number of loops that lie substantially in the same plane, thereby forming an opening for a to-be-formed inductor. In addition, first trace opening 414 can expose a via. (Opening 414 can expose more than one via, or no vias if an overlying metal layer and vias are used to make an electrical connection). Once first trace opening 414 has been formed, mask 412 is then removed. Next, a first layer of conductive material, such as copper or aluminum, is formed on insulation layer 410 to fill up first trace opening 414.

Figure 4B:
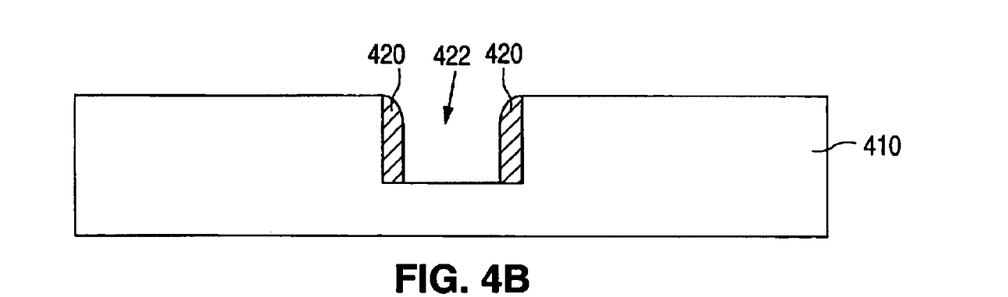

After this, as shown in FIG. 4B, the first layer of conductive material is anisotropically etched to form a first conductive spacer 420 along the side walls of first trace opening 414. In addition, the etch forms a second trace opening 422 which, due to the presence of spacer 420, is smaller than first trace opening 414.

Figure 4C:
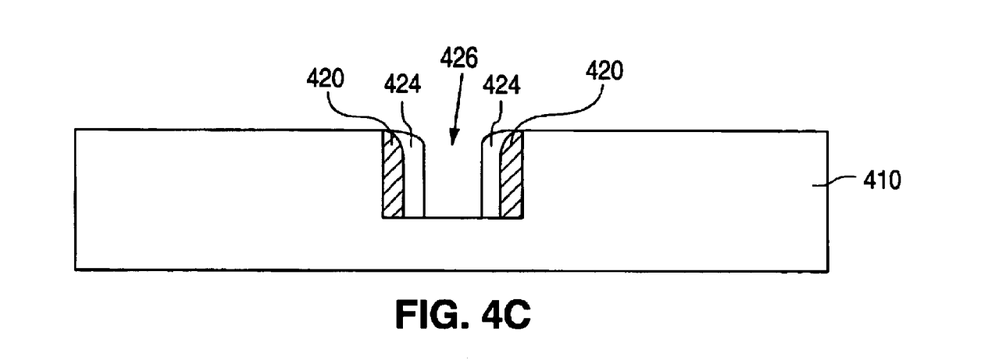

Following this, a first layer of isolation material, such as an oxide, is formed on insulation layer 410 and spacer 420 to fill up second trace opening 422. After this, as shown in FIG. 4C, the first layer of isolation material is anisotropically etched to form first isolation spacers 424 that adjoin first conductive spacers 420. In addition, the etch forms a third trace opening 426 which, due to the presence of spacer 424, is smaller than second trace opening 422.

Figure 4D:
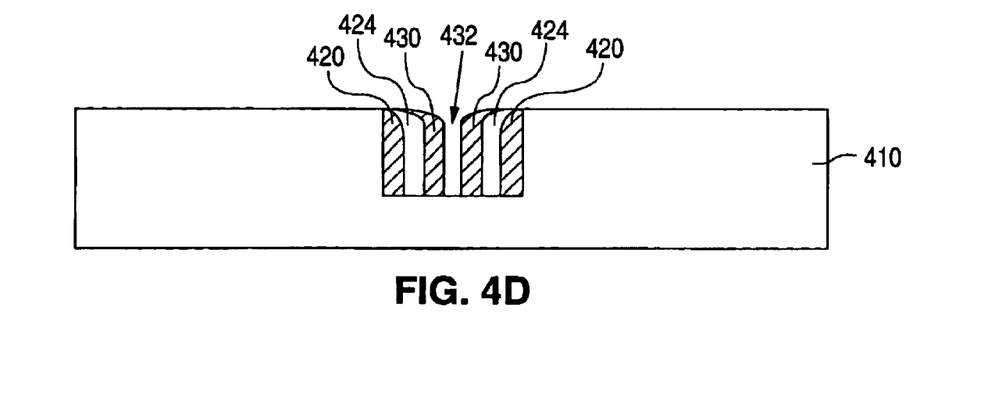

Once the first isolation spacers 424 have been formed, a second layer of conductive material, such as copper or aluminum, is formed on insulation layer 410, spacer 420, and spacer 424 to fill up third trace opening 426. After this, as shown in FIG. 4D, the second layer of conductive material is anisotropically etched to form second conductive spacers 430 along the side walls of third trace opening 426. In addition, the etch forms a fourth trace opening 432 which, due to the presence of spacer 430, is smaller than third trace opening 426.

Figure 4E:
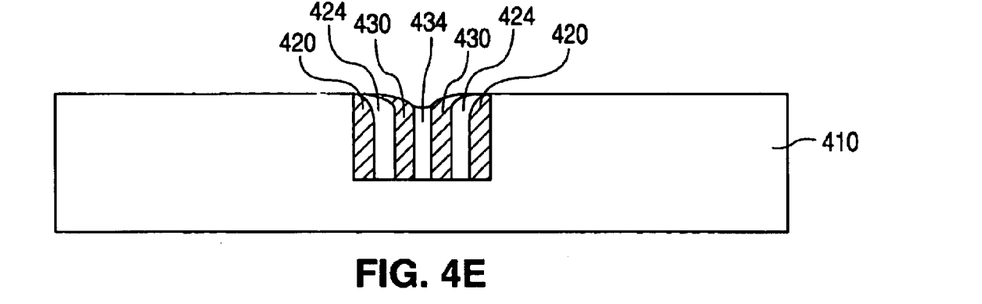

Following this, a second layer of isolation material, such as an oxide, is formed on insulation layer 410 and spacers 420, 424, and 430 to fill up fourth trace opening 432. After this, as shown in FIG. 4E, the layer of isolation material is anisotropically etched to form a center isolation region 434 that adjoins the second conductive spacers 430.

Figure 4F:
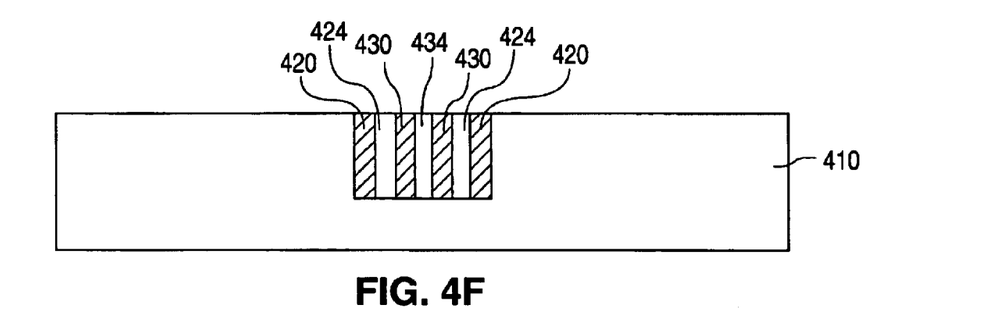

As shown in FIG. 4F, after center isolation region 434 has been formed, insulation layer 410, spacers 420, 424, and 430, and center isolation region 434 are planarized so that insulation layer 410, spacers 420, 424, and 430, and center isolation region 434 have top surfaces that lie substantially in the same plane.

Figure 4G:
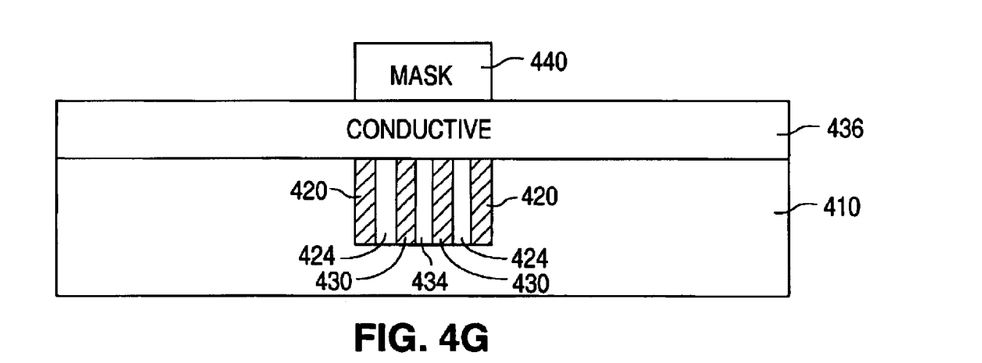
Figure 4H:
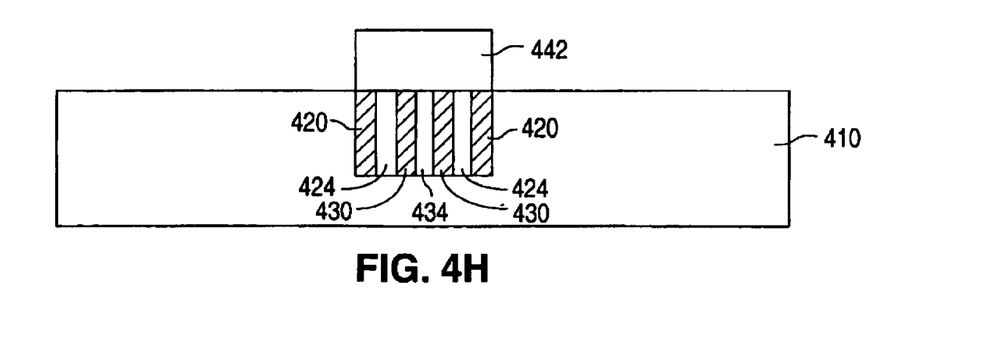

Next, as shown in FIG. 4G, a third layer of conductive material 436 is formed on insulation layer 410, spacers 420, 424, and 430, and center isolation region 434. Following this, a layer of masking material 440 is formed and patterned on conductive layer 436. After this, as shown in FIG. 4H, the exposed regions of conductive layer 436 are etched to form a base region 442 of the trace. Mask 440 is then removed and the process continues with conventional steps.

Figure 4I:
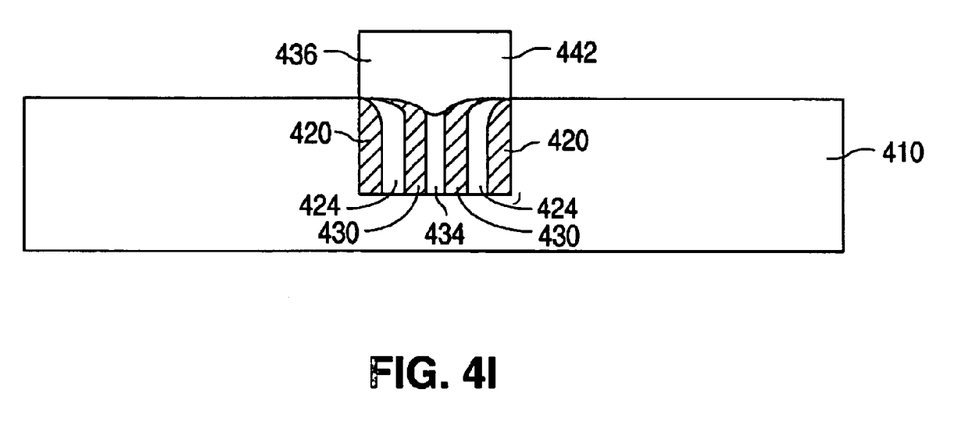

In a first alternate embodiment, the planarization step can be omitted. As shown in FIG. 4I, rather than planarizing, the third layer of conductive material 436 can be formed directly on insulation layer 410, spacers 420, 424, and 430, and center isolation region 434. After the third layer of conductive material 436 is formed, third conductive layer 436 is then masked and etched, as described above, to form base region 442 of the trace. In this case, the bottom surface of base region 442 is not substantially planar.

In the present invention, the first and second conductive spacers 420 and 430 can be formed from the same or different materials. In addition, spacer 424 and center isolation region 434 can be formed from the same or different materials. Further, although the present example has been described in terms of using two metal depositions to form four fingers, one metal deposition can be used to form two fingers, and more than two metal depositions can be used to form more than four fingers.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A semiconductor device comprising:
    a layer of insulation material formed over a semiconductor substrate; and
    a metal trace formed in the layer of insulation material, the metal trace having a base region and a plurality of spaced-apart fingers that extend away from a bottom surface of the base region, a top surface of the metal trace and a top surface of the insulation material lying in different horizontal planes, the metal trace formlng a number of loops such that the base region is formed in a number of loops.
2. The semiconductor device of claim 1 wherein the loops lie substantially in a same plane.
3. The semiconductor device of claim 1 wherein the metal trace has a first end and a second end.
4. The semiconductor device of claim 3 wherein the second end is connected to a via.
5. The semiconductor device of claim 4 and further comprising a metal trace segment that makes an electrical connection with the via, and lies under a portion of the loops.
6. The semiconductor device of claim 5 wherein the metal trace segment has a plurality of fingers that extend away from a bottom surface of the metal trace segment.

7. The semiconductor device of claim 5 wherein the metal trace segment has a width, a length that is substantially greater than the width, and a plurality of fingers that extend away from a bottom surface of the metal trace segment and run from a first end of the metal trace segment to a second end of the metal trace segment.

8. The semiconductor device of claim 7 wherein the fingers run continuously from the first end of the metal trace segment to the second end of the metal trace segment.

9. The semiconductor device of claim 1 wherein the fingers are formed in a number of loops.

10. A semiconductor device comprising:
 a layer of insulation material formed over a semiconductor substrate; and
 a metal trace formed in the layer of insulation material, the metal trace having a width, a length that is substantially greater than the width, and a plurality of spaced-apart fingers that extend away from a bottom side of the metal trace and run from a first end of the metal trace to a second end of the metal trace along the length, a top surface of the metal trace and a top surface of the insulation material lying in different horizontal planes.

11. The semiconductor device of claim 10 wherein the metal trace forms a number of loops.

12. The semiconductor device of claim 11 wherein the loops lie substantially in a same plane.

13. The semiconductor device of claim 10 wherein the second end is connected to a via.

14. The semiconductor device of claim 13 and further comprising a metal trace segment that makes an electrical connection with the via, and lies lower than the metal trace.

15. The semiconductor device of claim 14 wherein the metal trace segment has a plurality of fingers that extend away from a bottom surface of the metal trace segment.

16. The semiconductor device of claim 14 wherein the metal trace segment has a width, a length that is substantially greater than the width, and a plurality of fingers that extend away from a bottom surface of the metal trace segment and run from a first end to a second end of the metal trace segment along the length.

17. The semiconductor device of claim 10 wherein the fingers run continuously from the first end to the second end.

* * * * *

UNITED STATES PATENT AND TRADEMARK OFFICE
CERTIFICATE OF CORRECTION

PATENT NO. : 6,740,956 B1
DATED : May 25, 2004
INVENTOR(S) : Hopper et al.

It is certified that error appears in the above-identified patent and that said Letters Patent is hereby corrected as shown below:

Column 6,
Line 53, delete "formlng" and replace with -- forming --.

Signed and Sealed this

Twenty-first Day of December, 2004

JON W. DUDAS
*Director of the United States Patent and Trademark Office*